(12) United States Patent
White

(10) Patent No.: US 7,853,904 B2
(45) Date of Patent: Dec. 14, 2010

(54) METHOD AND SYSTEM FOR HANDLING PROCESS RELATED VARIATIONS FOR INTEGRATED CIRCUITS BASED UPON REFLECTIONS

(75) Inventor: David White, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 461 days.

(21) Appl. No.: 11/768,891

(22) Filed: Jun. 26, 2007

(65) Prior Publication Data

US 2008/0027698 A1    Jan. 31, 2008

Related U.S. Application Data

(63) Continuation-in-part of application No. 11/005,651, filed on Dec. 6, 2004, now Pat. No. 7,383,521, which is a continuation of application No. PCT/US03/17655, filed on Jun. 4, 2003, and a continuation-in-part of application No. 10/165,214, filed on Jun. 7, 2002, now Pat. No. 7,393,755, and a continuation-in-part of application No. 10/164,844, filed on Jun. 7, 2002, now Pat. No. 7,124,386, and a continuation-in-part of application No. 10/164,847, filed on Jun. 7, 2002, now Pat. No. 7,152,215, and a continuation-in-part of application No. 10/164,842, filed on Jun. 7, 2002, now abandoned, and a continuation-in-part of application No. 10/200,660, filed on Jul. 22, 2002, now Pat. No. 7,363,099, and a continuation-in-part of application No. 10/321,283, filed on Dec. 17, 2002, now Pat. No. 7,174,520, and a continuation-in-part of application No. 10/321,298, filed on Dec. 17, 2002, now Pat. No. 7,367,008, and a continuation-in-part of application No. 10/321,281, filed on Dec. 17, 2002, now Pat. No. 7,243,316, and a continuation-in-part of application No. 10/321,777, filed on Dec. 17, 2002, now Pat. No. 7,353,475, and a continuation-in-part of application No. 10/321,290, filed on Dec. 17, 2002, now Pat. No. 7,325,206.

(51) Int. Cl.
*G06F 17/50* (2006.01)
(52) U.S. Cl. .................................. 716/4; 716/10; 703/13
(58) Field of Classification Search ................... 716/4, 716/6, 10–14; 703/13–14
See application file for complete search history.

(56) References Cited

U.S. PATENT DOCUMENTS 5,124,927 A    6/1992    Hopewell (Continued)

FOREIGN PATENT DOCUMENTS

EP    0453753    10/1991

(Continued)

OTHER PUBLICATIONS

U.S. Appl. No. 11/678,593, filed Feb. 24, 2007.

(Continued)

*Primary Examiner*—Stacy A Whitmore
(74) *Attorney, Agent, or Firm*—Vista IP Law Group LLP

(57) ABSTRACT

Disclosed is an approach for modeling and correcting for the effects of reflections during lithography processing. Thickness differences across the surfaces in different integrated circuit layers may result in reflectance-related variations. The variations may be modeled and accounted for during the design process for the integrated circuit.

33 Claims, 12 Drawing Sheets

U.S. PATENT DOCUMENTS

| | | | |
|---|---|---|---|
| 5,433,651 A * | 7/1995 | Lustig et al. | 451/6 |
| 5,581,475 A | 12/1996 | Majors | |
| 5,597,668 A | 1/1997 | Nowak et al. | |
| 5,655,108 A * | 8/1997 | Uchiyama | 716/4 |
| 5,663,076 A | 9/1997 | Rostoker et al. | |
| 5,705,301 A | 1/1998 | Garza et al. | |
| 5,763,955 A | 6/1998 | Findley et al. | |
| 5,798,298 A | 8/1998 | Yang et al. | |
| 5,821,621 A | 10/1998 | Jeng | |
| 5,835,225 A * | 11/1998 | Thakur | 356/630 |
| 5,838,448 A * | 11/1998 | Aiyer et al. | 356/632 |
| 5,854,125 A | 12/1998 | Harvery | |
| 5,861,342 A | 1/1999 | Gabriel et al. | |
| 5,903,469 A | 5/1999 | Ho | |
| 5,920,487 A | 7/1999 | Reich et al. | |
| 5,923,563 A | 7/1999 | Lavin et al. | |
| 5,923,947 A | 7/1999 | Sur | |
| 5,948,573 A | 9/1999 | Takahashi | |
| 5,972,541 A | 10/1999 | Sugasawara et al. | |
| 6,049,789 A | 4/2000 | Frison et al. | |
| 6,081,272 A | 6/2000 | Morimoto et al. | |
| 6,093,631 A | 7/2000 | Jaso et al. | |
| 6,109,775 A | 8/2000 | Tripathi et al. | |
| 6,118,137 A | 9/2000 | Fulford et al. | |
| 6,124,197 A | 9/2000 | Fulford | |
| 6,157,947 A | 12/2000 | Watanabe et al. | |
| 6,176,992 B1 | 1/2001 | Talieh | |
| 6,209,484 B1 * | 4/2001 | Huang et al. | 118/723 E |
| 6,230,299 B1 | 5/2001 | McSherry et al. | |
| 6,249,904 B1 | 6/2001 | Cobb | |
| 6,255,125 B1 | 7/2001 | Schmidt et al. | |
| 6,259,115 B1 | 7/2001 | You et al. | |
| 6,263,476 B1 | 7/2001 | Browen et al. | |
| 6,289,499 B1 | 9/2001 | Rieger et al. | |
| 6,309,956 B1 | 10/2001 | Chiang et al. | |
| 6,323,113 B1 | 11/2001 | Gabriel et al. | |
| 6,327,555 B1 | 12/2001 | Shimizu et al. | |
| 6,328,872 B1 | 12/2001 | Talieh et al. | |
| 6,335,235 B1 * | 1/2002 | Bhakta et al. | 438/221 |
| 6,343,370 B1 | 1/2002 | Taoka et al. | |
| 6,344,408 B1 | 2/2002 | Chen | |
| 6,344,409 B1 | 2/2002 | Jaso et al. | |
| 6,352,623 B1 | 3/2002 | Volodarsky et al. | |
| 6,355,387 B1 | 3/2002 | Fujinaga et al. | |
| 6,380,087 B1 | 4/2002 | Gupta et al. | |
| 6,396,158 B1 | 5/2002 | Travis et al. | |
| 6,486,066 B2 | 11/2002 | Cleeves et al. | |
| 6,539,321 B2 | 3/2003 | Bruce et al. | |
| 6,550,041 B1 | 4/2003 | McBride | |
| 6,556,884 B1 | 4/2003 | Miller et al. | |
| 6,556,947 B1 | 4/2003 | Scheiner et al. | |
| 6,562,639 B1 | 5/2003 | Minvielle et al. | |
| 6,567,964 B2 | 5/2003 | Shin et al. | |
| 6,578,174 B2 | 6/2003 | Zizzo | |
| 6,578,188 B1 | 6/2003 | Pang et al. | |
| 6,611,045 B2 | 8/2003 | Travis et al. | |
| 6,613,688 B1 | 9/2003 | Brown et al. | |
| 6,625,801 B1 | 9/2003 | Pierrat et al. | |
| 6,651,226 B2 | 11/2003 | Houge et al. | |
| 6,660,569 B1 | 12/2003 | Barthelmess et al. | |
| 6,665,856 B1 | 12/2003 | Pierrat et al. | |
| 6,671,570 B2 | 12/2003 | Schulze | |
| 6,691,297 B1 | 2/2004 | Misaka et al. | |
| 6,704,920 B2 | 3/2004 | Brill et al. | |
| 6,708,129 B1 | 3/2004 | Pasadyn et al. | |
| 6,708,318 B2 | 3/2004 | Satoh et al. | |
| 6,742,165 B2 | 5/2004 | Lev et al. | |
| 6,751,785 B1 | 6/2004 | Oh | |
| 6,866,974 B2 | 3/2005 | Kim et al. | |
| 6,869,739 B1 * | 3/2005 | Ausschnitt et al. | 430/30 |
| 6,873,720 B2 | 3/2005 | Cai et al. | |
| 6,893,800 B2 | 5/2005 | Jessen et al. | |
| 6,904,581 B1 | 6/2005 | Oh | |
| 7,124,386 B2 * | 10/2006 | Smith et al. | 716/10 |
| 7,152,215 B2 | 12/2006 | Smith et al. | |
| 7,174,520 B2 | 2/2007 | White et al. | |
| 7,243,316 B2 | 7/2007 | White et al. | |
| 7,325,206 B2 | 1/2008 | White et al. | |
| 7,353,475 B2 | 4/2008 | White et al. | |
| 7,356,783 B2 | 4/2008 | Smith et al. | |
| 7,360,179 B2 | 4/2008 | Smith et al. | |
| 7,363,099 B2 | 4/2008 | Smith et al. | |
| 7,363,598 B2 | 4/2008 | Smith et al. | |
| 7,367,008 B2 | 4/2008 | White et al. | |
| 7,380,220 B2 | 5/2008 | Smith et al. | |
| 7,382,447 B2 * | 6/2008 | Mieher et al. | 356/125 |
| 7,383,521 B2 | 6/2008 | Smith et al. | |
| 7,393,755 B2 | 7/2008 | Smith et al. | |
| 2001/0031506 A1 | 10/2001 | Plat et al. | |
| 2001/0052107 A1 | 12/2001 | Anderson et al. | |
| 2002/0045110 A1 | 4/2002 | Ohnuma | |
| 2002/0083401 A1 | 6/2002 | Breiner et al. | |
| 2002/0106837 A1 | 8/2002 | Cleeves et al. | |
| 2002/0157076 A1 | 10/2002 | Asakawa | |
| 2002/0162082 A1 | 10/2002 | Cwynar et al. | |
| 2003/0045100 A1 * | 3/2003 | Saka et al. | 438/689 |
| 2003/0084416 A1 | 5/2003 | Dai et al. | |
| 2003/0107134 A1 | 6/2003 | Lee | |
| 2003/0199150 A1 | 10/2003 | Permana et al. | |
| 2003/0228714 A1 | 12/2003 | Smith et al. | |
| 2003/0229410 A1 | 12/2003 | Smith et al. | |
| 2003/0229412 A1 | 12/2003 | White et al. | |
| 2003/0229868 A1 | 12/2003 | White et al. | |
| 2003/0229875 A1 | 12/2003 | Smith et al. | |
| 2003/0229880 A1 | 12/2003 | White et al. | |
| 2003/0229881 A1 | 12/2003 | White et al. | |
| 2003/0237064 A1 | 12/2003 | White et al. | |
| 2004/0044984 A1 | 3/2004 | Keogan et al. | |
| 2004/0058255 A1 | 3/2004 | Jessen et al. | |
| 2004/0076896 A1 | 4/2004 | Kim et al. | |
| 2004/0107410 A1 | 6/2004 | Misaka et al. | |
| 2005/0037522 A1 | 2/2005 | Smith et al. | |
| 2005/0051809 A1 | 3/2005 | Smith et al. | |
| 2005/0132306 A1 | 6/2005 | Smith et al. | |
| 2005/0196964 A1 | 9/2005 | Smith et al. | |
| 2005/0235246 A1 | 10/2005 | Smith et al. | |
| 2005/0240895 A1 * | 10/2005 | Smith et al. | 716/19 |
| 2005/0289500 A1 | 12/2005 | Misaka et al. | |
| 2007/0101305 A1 | 5/2007 | Smith et al. | |
| 2007/0157139 A1 | 7/2007 | White et al. | |
| 2007/0256039 A1 | 11/2007 | White | |
| 2008/0160646 A1 | 7/2008 | White et al. | |
| 2008/0162103 A1 | 7/2008 | White et al. | |
| 2008/0163139 A1 | 7/2008 | Scheffer et al. | |
| 2008/0163141 A1 | 7/2008 | Scheffer et al. | |
| 2008/0163142 A1 | 7/2008 | White et al. | |
| 2008/0163148 A1 | 7/2008 | Scheffer et al. | |
| 2008/0163150 A1 | 7/2008 | White et al. | |
| 2008/0216027 A1 | 9/2008 | White et al. | |
| 2009/0031261 A1 | 1/2009 | Smith et al. | |
| 2009/0031271 A1 | 1/2009 | White et al. | |
| 2009/0199139 A1 | 8/2009 | White et al. | |

FOREIGN PATENT DOCUMENTS

| | | |
|---|---|---|
| EP | 03079240 | 9/2003 |
| EP | 2003079240 | 9/2003 |

OTHER PUBLICATIONS

U.S. Appl. No. 11/678,592, filed Feb. 24, 2007.
U.S. Appl. No. 11/678,594, filed Feb. 24, 2007.
U.S. Appl. No. 11/768,851, filed Jun. 26, 2007.

Ohta, et al. "A New SP (simultaneous polishing) Model for Copper CMP Processes" International Conference on Simulation of Semiconductor Processes and Devices (SISPAD '02), Piscathaway, NJ, Sep. 4-6, 2002, pp. 257-260.

Tian et al., "Model-Based Dummy Feature Placement for Oxide Chemical-Mechanical Polishing Manufacturability", Proceedings of the 37th Design Automation Conference, pp. 667-670, 2000.

Bakker "Using Calibre in a Design for Manufacturing Environment" Deep Submicron Technical Publication, Mentor Graphics, Sep. 2001.

Boning, D. et al. "Statistical Metrologoy of Interlevel Dielectric Thickness Variation" Proceedings of the SPIE Smposium on Microelectronic Manufacturing, Oct. 1994, vol. 2334, pp. 316-327.

Boning, D. et al. "Models for Pattern Dependencies: Capturing Effects in Oxide, STI and Copper CMP" Jul. 17, 2001Semcon West.

Boning, D. et al. "Pattern Dependent Modeling for CMP Optimization and Control" MRS Spring Meeting, Proc. Symposium P: Chemical Mechanical Polishing, San Francisco, CA, Apr. 1999.

Boning, D. et al. "A General Semiconductor Process Modeling Framework" IEEE Transactions on Semiconductor Manufacturing, Nov. 1992, vol. 5, No. 4, pp. 266-280.

Chen, Y. et al. "Monte-Carlo Algorithms for Layout Density Control" Asia and South Pacific Design Automation Conference, Jan. 2002, pp. 523-528.

Chen, Y. et al. "Hierarchical Dummy Fill for Process Uniformity" Asia and South Pacificd Design Automation Conference, Jan. 2001, pp. 139-144.

Chen, Y. et al. "Practical Iterated Fill Sythesis for CMP Uniformity" ACM/IEEE Design Automation Converence, Jun. 2000, pp. 671-674.

Conrad, et al. "Model Considerations, Calibration Issues, and Metrology Methods for Resist-Bias Models" in Metrology, Inspection, and Process Control for Microlithography XIII, B. Singh, et., Proc. SPIE 3677, 1999, pp. 940-955.

Davis, J.C. et al. "Automatic Synthesis of Equipment Recipes from Specified Wafer-State Transitions" IEEE Transactions on Semiconductor Manufacturing, Nov. 1998, vol. 11, No. 4, pp. 527-536.

Hosack, H.H. et al. "Recent Advances in Process Synthesis for Semiconductor Devices" IEEE Transactions on Electron Devices, Mar. 1998, vol. 45, No. 3, pp. 626-633.

Kahng, A.B. et al. "New and Exact Filling Algorithms for Layout Density Control" UCLA Department of Computer Science, Los Angeles, CA, 1999.

Kahng, A.B. et al. "Filling and Slotting: Analysis and Algorithms" International Symposium on Physical Design, Monterey, CA, 1998, pp. 95-102.

Kahng, A.B. et al. "New Multilevel and Hierarchical Algorithms for Layout Density Control" UCLA Department of Computer Science, Los Angeles, 1999.

Kim, Y.-H. et al. "CHAMPS(CHemicAl-Mechanical Planarization Simulator)" International Conference on Simulation of Semiconductor Processes and Devices, Seattle, WA, Sep. 6-8, 2000.

Lee, B. et al. "Using Smart Dummy Fill and Selective Reverse Etchback for Pattern Density Equalization" Proceedings CMP-MIC, Santa Clara, CA Mar. 2000, pp. 255-258.

Lee, K.-H. "Analyzing the Effects of Floating Dummy Fills: From Feature Scale Analysis to Full-Chip RC Extraction" 2001 Samsung Electronics Co., Ltd., Korea.

Mehrotra, V. et al. "Technology Scaling Impact of Variation on Clock Skew and Interconnect Delay" international Interconnect Technology Conference (IITC), San Francisco, CA, Jun. 2001.

Mehrotra, V. et al. "A Methodology for Modeling the Effects of Systematic Within-Die Interconnect and Device Variation on Circuit Performance" Design Automation Conference, Los Angeles, CA, Jun. 2000.

Mehrotra, V. et al. "Modeling the Effects of Manufacturing Variation on High-Speed Microprocessor Interconnect Performance" Annual ACM-IEEE Design Automation Conference, Los Angeles, CA, 2000, pp. 168-171.

McGhee, J. et al. "The MMST Computer-Integrated Manufacturing System Framework" IEEE Transactions of Semiconductor Manufacturing, May 1994, vol. 7, No. 2, pp. 107-116.

Saxena et al, "A methodology for the top-down synthesis of semiconductor process flows," Proc. 3rd IEEE/SEMI int. Symp. Semiconductor Manufacturing, pp. 36-40, 1995.

Moyne, W.P. "Enhancing MEMS Design using Statistical Process Information," Massachusetts Institute of Technology, Department of Electrical Engineering and Computer Science, Apr. 7, 2000.

"MIT Statistical metrology" Publications List, located at http://www-mti.mit.edu/Metrology/PAPERS/, 1994-2003.

Park, T.H. et al., "Pattern Dependent Modeling of Electplated Copper Profiles," internationl Interconnect Technology Conference (IITC), Jun. 2001.

Park, T. et al., "Electrical Characterization of Copper Chemical mechanical Polishing." SEMATECH, Austin, TX, Feb. 1999.

Park, T. et al., "Pattern and Process Dependencies in Copper Damascene Chemical mechanical polishing Processes," VLSI Multilevel Interconnect Conference (VMIC), Santa Clara, CA, Jun. 1998.

Peters, L. "Removing Barriers to Low-k Dielectric Adoption," Semiconductro international, May 1, 2002.

Sakurai, T. "Closed-Form Expressions for interconnection Delay, Coupling, and Crosstalk in VLSI's" IEEE Transactions on Electron Devices, vol. 40, No. 1, Jan. 1993.

Singer, P. "Progress in Copper: A Look Ahead," Semiconductor international, May 1, 2002.

Smith, T.H. "Device Independent process Control of Dielectric Chemical mechanical Polishing", Thesis—MIT, Sep. 27, 1999.

Smith, T.H. et al., "A CMP Model Combining Density and Time Dependencies," proc. CMP-MIC, Santa Clara, CA, Feb. 1999.

Stine, B.E. "A General Methodology for Assessing and Characterizing Variation in Semiconductor Manufacturing" Thesis, Massachusetts Institutue of Technology, Sep. 1997.

Stine, B.E. et al. "A Simulation Methodology for Assessing the Impact of Spatial/Pattern Dependent Interconnect Parameter Variation on Circuit Performance" 1997 International Electron Devices Meeting, Washington, DC, Dec. 1997, pp. 133-136.

Stine, B. et al. "The Physical and Electrical Effects of metal-Fill Patterninng Practices for Oxide Chemical-Mechanical polishing Processes" IEEE Transactions of Electron Devices, Mar. 1998, vol. 45, No. 3, pp. 665-679.

Stine, B.E. et al. "On the Impact of Dishing in Metal CMP Processes on Circuit Performance" International Workshop on Statistical metrology Technical Papers, 1998, pp. 64-67.

Stine, B. et al. "A Closed-From Analytic Model for ILD Thickness Variation in CMP Processes" Proc. CMP-MIC, Santa Clara, CA Feb. 1997.

Tuinhout, H.P. et al. "Characterization of Systematic MOSFET Current Factoer Mismatch Caused by Metal CMP dummy Structures" IEEE Transactions on Semiconductor Manufacturing, Nov. 2001, vol. 14, No. 4, pp. 302-312.

Tugbawa, T. et al. "A Mathematical Model of Pattern Dependencies in Cu CMP Processes" CMP Symposium, Electrochemical Society Meeting, Honolulu, HA, Oct. 1999.

Tugbawa, T. et al. "Integrated Chip-Scale Simulation of Pattern Dependencies in Copper Electroplating and Copper Chemical Mechanical Polishing processes" International Interconnect Technology Conference, San Francisco, CA, Jun. 2002.

Tugbawa, T. et al. "Framework for Modeling of Pattern Dependencies in Multi-Step Cu CMP Processes," Semicon West 2000, Jul. 11, 2000.

Zaman M.H. et al. "Automatic Generation of Thin Film Process Flows—Part I: Basic Algorithms" IEEE Transactions on Semiconductor Manufacturing, vol. 12, n. 1, Feb. 1999, pp. 116-128.

Zaman M.H. et al. "Automatic Generation of Thin Film Process Flows—Part II: Recipe Generation, Flow Evaluation, and System Framework" IEEE Transactions on Semiconductor Manufacturing, Feb. 1999, vol. 12, No. 1, pp. 129-138.

The Information Disclosure Statement (IDS) submission on Jul. 5, 2005 for U.S. Appl. No. 11/005,651, including the IDS transmittal letter, form PTO-1449, and all references, including items "Slide Presentation Exhibit A" AVVVV, "Slied Presentation Exhibit B1" AWWWW, "Slied Presentation Exhibit B2" AXXXX, and "Praesagus Business Plan, Exhibit C." AYYYY in the Non-Patent Literature section.

"MIT Statistical metrology" Publications List, located at http://www-mti.mit.edu/Metrology/PAPERS/, 1994-2003.

Kahng, A.B. et al. "Filling Algorithms and Analyses for Layout Density Control" IEEE Transactions on computer-Aided Design of integrated Circuits and Systems, Apr. 1999, vol. 18, No. 4, pp. 445-462.

Tugbawa, T. et al, "Modeling of Pattern Dependencies for Multi-Level Copper Chmical-Mechanical Polishing processes," Material Research Society Spring Meeting, San Francisco, CA, Apr. 2001.

Park, J-K, "An-Exhaustive Method for Characterizing the Interconnect Capacitance Considering the Floating Dummy-Fills by Employing an Efficient Field Solving Algorithm," International Conference on Simulation of Semiconductor Processes and Devices, 2000, pp. 98-101.

* cited by examiner

METHOD AND SYSTEM FOR HANDLING PROCESS RELATED VARIATIONS FOR INTEGRATED CIRCUITS BASED UPON REFLECTIONS

CROSS-REFERENCE TO RELATED APPLICATIONS

The present application is a continuation-in-part of U.S. patent application Ser. No. 11/005,651, filed on Dec. 6, 2004, which is a continuation of Patent Cooperation Treaty Application No. PCT/US2003/17655, filed on Jun. 4, 2003, which is a continuation-in-part of U.S. patent application Ser. No. 10/165,214, filed on Jun. 7, 2002, a continuation-in-part of U.S. patent application Ser. No. 10/164,844, filed on Jun. 7, 2002, now U.S. Pat. No. 7,124,386, a continuation-in-part of U.S. patent application Ser. No. 10/164,847, filed on Jun. 7, 2002, now U.S. Pat. No. 7,152,215, a continuation-in-part of U.S. patent application Ser. No. 10/164,842, filed on Jun. 7, 2002, now abandoned, a continuation-in-part of U.S. patent application Ser. No. 10/200,660, filed on Jul. 22, 2002, a continuation-in-part of U.S. patent application Ser. No. 10/321,283, filed on Dec. 17, 2002, now U.S. Pat. No. 7,174,520, a continuation-in-part of U.S. patent application Ser. No. 10/321,298, filed on Dec. 17, 2002, a continuation-in-part of U.S. application Ser. No. 10/321,281, filed on Dec. 17, 2002, a continuation-in-part of U.S. application Ser. No. 10/321,777, filed on Dec. 17, 2002, and a continuation-in-part of U.S. application Ser. No. 10/321,290, filed on Dec. 17, 2002, all of which are incorporated by reference herein in their entireties.

BACKGROUND AND SUMMARY

The invention is directed to an improved approach for designing, testing, and manufacturing integrated circuits.

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

Based upon this geometric information, photomasks are created for lithographic manufacturing of the electronic product. A photomask, or more simply a "mask," provides the master image of one layer of a given integrated chip's physical geometries. A typical photolithography system projects UV light energy on to and through the mask in order to transmit the mask pattern in reduced size to the wafer surface, where it interacts with a photosensitive coating on the wafer.

Other processes may also occur during the process of manufacturing an intenerated circuit. For example, etching, Electroplated copper deposition (ECD), and chemical mechanical polishing (CMP) may be used to form interconnects for the IC. The lithographic patterns define the dimensions of the circuitry that is transferred to a silicon wafer, with the patterns subsequently used with the etch process to physically etch the features into the wafer surface or other thin films deposited on the wafer surface. Etch equipment includes mechanisms to selectively remove materials (e.g. oxide) from a wafer surface or thin films on the wafer surface patterned with lithography equipment. ECD is a process step in a copper damascene flow that is used to deposit copper material within the interconnect structures.

However, significant variations may arise during the process of manufacturing the IC. For example, lithography mask creation and printing assume that projection is done on a film, within a predetermined depth of focus range. However pattern dependencies between the process by which the ICs are fabricated and the pattern that is being created often cause processed films to have significant variation in thickness across a surface, resulting in variation in feature dimensions (e.g. line widths) of ICs that are patterned using the mask.

In addition, the variation in thickness may cause sloping or curved surfaces to appear. These sloped or curved surfaces may result in reflected light during the lithography process. The reflected light may result in process variations that are not accounted for by existing or conventional process models.

Moreover, the projected light will be absorbed and transmitted through the resist. The propagation of light through the resist will influence spatial variation between the top and bottom of the exposed resist layer and may influence the resulting shape of the printed feature. The light may also reflect off an underlying material and toward the top surface of the photoresist inducing variation in the resulting feature shape as well. Variation in underlying material thickness may influence how the light propagates through the resist as well.

The present invention is directed to a method, system, and computer program product for modeling and correcting for the effects of such reflections during lithography processing. Other and additional objects, features, and advantages of the invention are described in the detailed description, figures, and claims.

DETAILED DESCRIPTION

Figure 1:
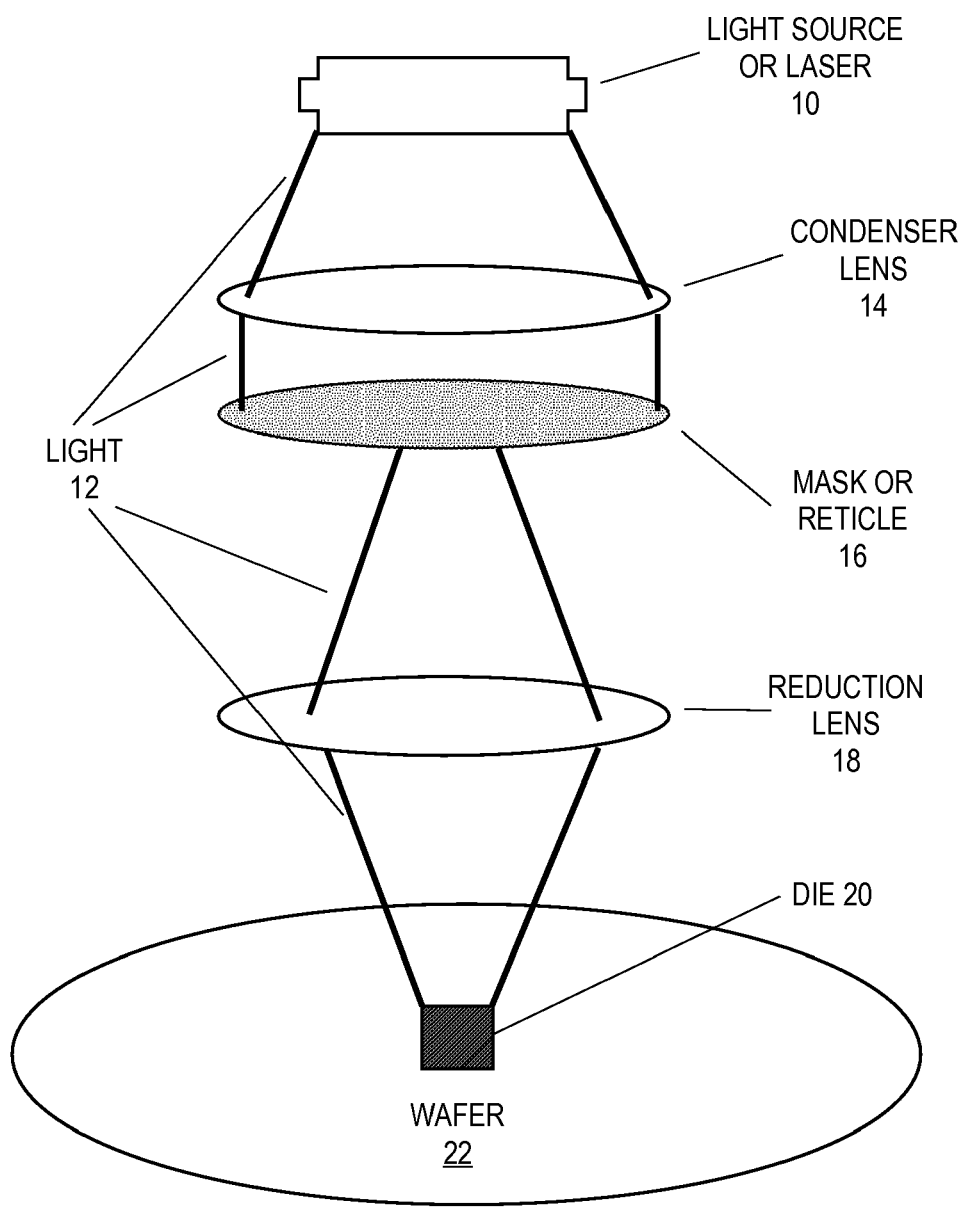
FIG. 1 illustrates how lithography works.

According to some embodiments, the present invention is directed to approaches that are useful to identify and correct, in advance of lithographic mask creation, areas of an integrated circuit (IC) that are likely to be problematic due to variations in film thickness, surface topography uniformity, and electrical impact that arise in the manufacture of an integrated circuit. The identifications or corrections may be based on predicted or modeled physical and electrical properties of a manufactured IC, arising from dependencies between predefined circuit layout patterns and the characteristics of the processes used in the manufacture of the integrated circuit.

These approaches are applicable to (a) high-density plasma (HDP) and chemical-mechanical polishing (CMP) processes used in the formation of shallow trench isolation (STI) structures; (b) lithographic, high-density plasma (HDP), electroplated copper deposition (ECD), and chemical mechanical polishing (CMP) processes used in the formation of single- and multi-level interconnect structures for integrated circuit (IC) devices; (c) processes and flows used to create oxide and low-k dielectric layers; (d) plasma-etch processes and the measurement of critical feature dimensions; (e) lithographic process flows that may include pre and post photo resist deposition and removal steps and a subsequent plasma etch step used to physically etch the patterned features into the wafer; (f) photoresist deposition and photoresist material selection, (g) any step or steps in damascene process flows; and (h) computation of corrections to mask dimensions to achieve desired critical IC dimensions.

In fabricating integrated circuits, the degree of interconnect film uniformity (in terms of both thickness and surface topography) is dependent on characteristics of circuit layout patterns (e.g. material density, line widths, line spaces, and other feature dimensions). Surface and thickness non-uniformities often lead to subsequent manufacturability and process integration issues. Pattern dependencies often cause processed films to have significant variation. The variation becomes worse as subsequent non-conformal layers are deposited and polished.

An integrated circuit (IC) typically includes multiple levels of materials that have been deposited, planarized, and selectively etched to reproduce circuitry defined by a computer-generated design. Lithography is a frequently repeated process step during the manufacture of ICs in which a pattern that defines the dimensions of the circuitry is transferred to a silicon wafer. The patterns are subsequently used with the etch process to physically etch the features into the wafer surface or other thin films deposited on the wafer surface. The terms feature dimensions or feature size refer to dimensions of the geometries within the circuit. Examples include: the width of a line, the spacing between structures (e.g. the spacing between two lines in an array of lines or a buffer distance between working circuitry and dummy fill structures), the critical dimension (CD) of a circuit (i.e. the smallest dimension of any geometry in the circuit), widths of arrays of lines or other repeating structures, as well as the metrics (e.g. minimum, maximum, and average) on individual geometries or on groups of geometries (e.g. an array of lines). Feature dimensions may also include vertical and other dimensions, including sidewall angle, feature height (e.g. trench depth). Lithography equipment includes mechanisms (e.g. steppers) used to project images of patterns onto wafers and pattern transfer tools (e.g., masks and reticles) used to transfer circuitry patterns onto wafers coated with a photosensitive film. Etch equipment includes mechanisms to selectively remove materials (e.g. oxide) from a wafer surface or thin films on the wafer surface patterned with lithography equipment.

A basic projection lithography process is illustrated in FIG. 1. A light source (e.g., a lamp or laser) 10 is used to project light 12 through a condenser lens 14, which directs light through a mask or reticle 16 that contains a pattern that represents the printed circuit features. The light 12 then passes through a reduction lens, which focuses the image onto a wafer 22. The minimum feature size that can be imaged can be defined using the Rayleigh equations as:

$$M_{f\lambda} = k_1 \frac{\lambda}{NA}$$

where $\Lambda$ is the exposing wavelength and NA is the numerical aperture of the optics. The parameter k.sub.1, normally between 0.65 and 0.4 for deep ultraviolet (DUV) imaging systems, is a process and system dependent variable that includes effects such as resist, process improvements, light source, and reticle characteristics.

Figure 2:
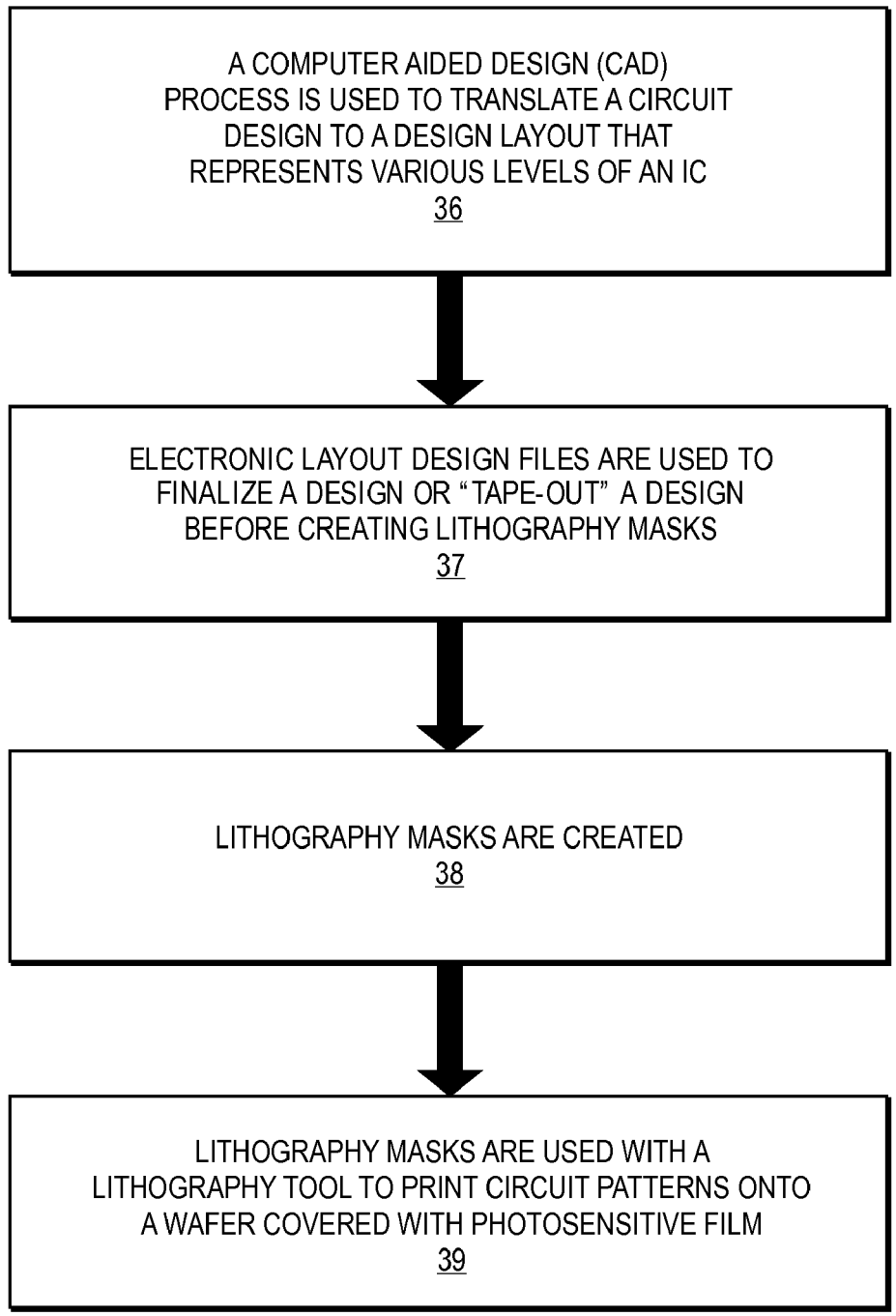
FIG. 2 describes the process for using IC designs and patterns to create lithography masks.

FIG. 2 describes the process of how a lithography mask may be created from an IC design. A computer-aided-design (CAD) system 36 is used to translate a functional circuit design to an electronic layout design file that represents a physical device, layer-by-layer. The result is a design layout that describes each level of the device from the lowest level, for example a transistor level, up to higher levels, for example interconnect layers that transmit signals among transistors and supply power to the components on the chip. The electronic design files are used during so-called tape-out to generate specifications for making a mask 37. The masks are then manufactured 38 and used with the lithography tool to transfer circuit features to a wafer 39.

Many projection systems use step-and-repeat mechanisms that expose only a sub-area of the wafer or a die, also referred to as the optical field, and then repeat the process until the entire wafer is imaged. The stepper may be controlled to accommodate wafer-level variation that occurs across the wafer as a result of, for example, warp or bow. This is normally used to accommodate variability that occurs from die to die, but not variability that occurs within each die. To ensure that the printed circuit is within a depth-of-focus associated with the optics, the stepper may adjust the focal length of the optics based on measurements of test keys or alignment marks, which are formed on a surface of the wafer, to accommodate variation in the thickness of the photosensitive film or photoresist. Underlying film thickness variation in materials below the photoresist often causes the variation.

Figure 3:
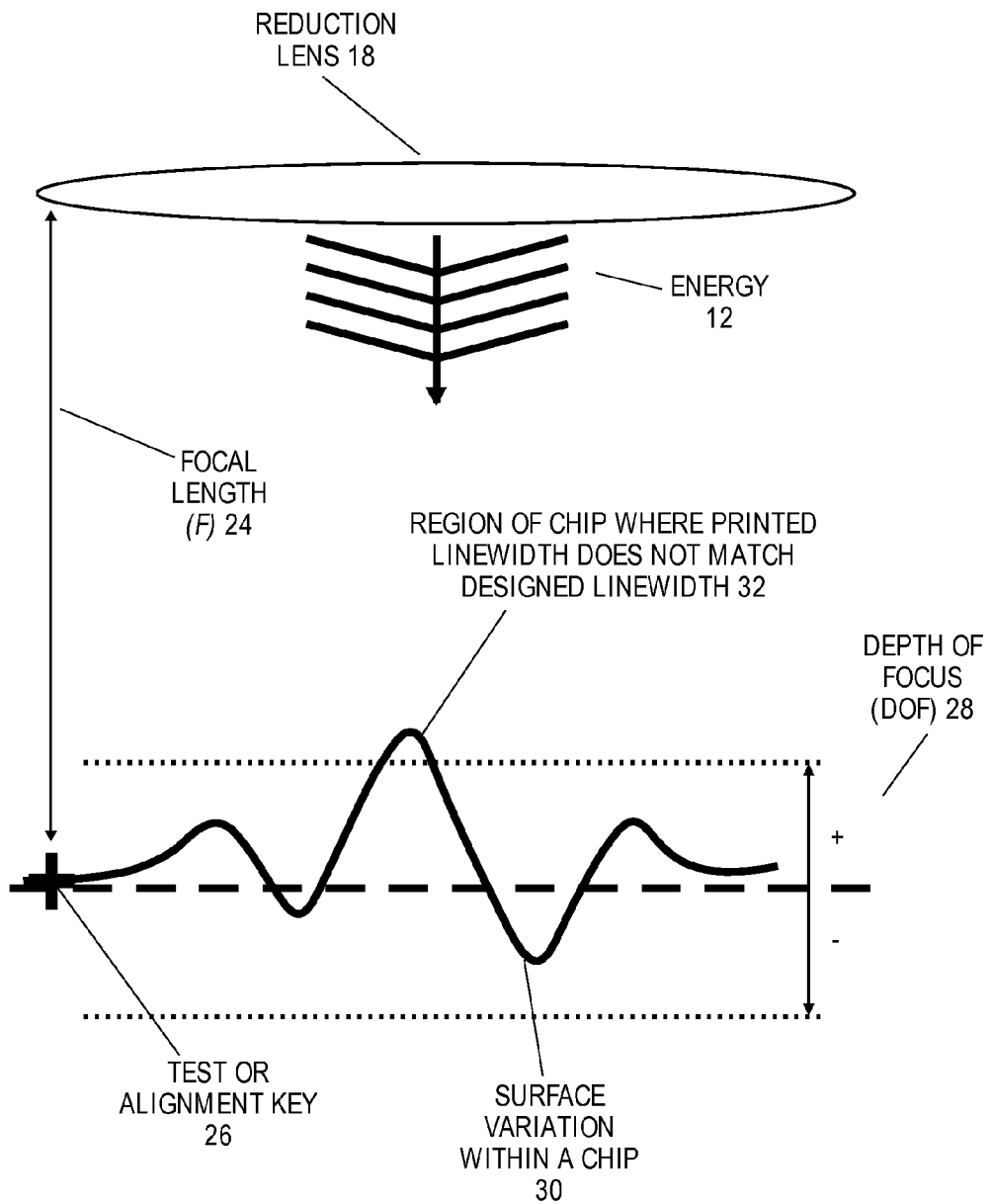
FIG. 3 illustrates a case in which the focal distance to an alignment key is proper; but chip-level variation is outside the depth of focus limits.

FIG. 3 illustrates that while the stepper can account for die-to-die variation, it may not adequately address within-die variation caused by IC pattern dependencies. The reduction lens 18 of FIG. 1 is shown above the die surface 30 in FIG. 3. The projection system adjusts so that the focal length 24 matches the measured distance to a test key or alignment mark 26. The depth of focus 28 determines what features along the optical axis can be reproduced with the desired resolution $M_f$. Using the Rayleigh equations, depth of focus $D_{f28}$ can be expressed as:

$$D_f = \pm k_2 \frac{\lambda}{(NA)^2}$$

where $\lambda$ is the exposing wavelength and NA is the numerical aperture of the optics. The parameter $k_2$ (normally around one for deep ultraviolet or DUV imaging systems) is a scaling factor based upon process related characteristics. During deposition of copper material via ECD or through the CMP of oxide or copper, for example, process related pattern dependencies often cause within-die variation 30 across the chip. If the chip-level variation exceeds the depth of focus, then the printed features 32 may not accurately represent the critical dimensions of the IC design as patterned on the mask and the errors, as imaged on the wafer, may negatively impact the performance of the device. As explained below, it is possible to adapt the mask design so that the printed IC dimensions better match the designed dimensions.

The next few paragraphs describe the cause and result of process-related IC pattern dependencies.

The lithography process is repeated throughout the manufacture of a semiconductor device as each subsequent layer is created. One area where the techniques described here may be particularly helpful is during a damascene process in which metal lines, that connect device components (called interconnect), are created. Multiple layers of connections are used to transmit signals and power among device components.

Figure 4:
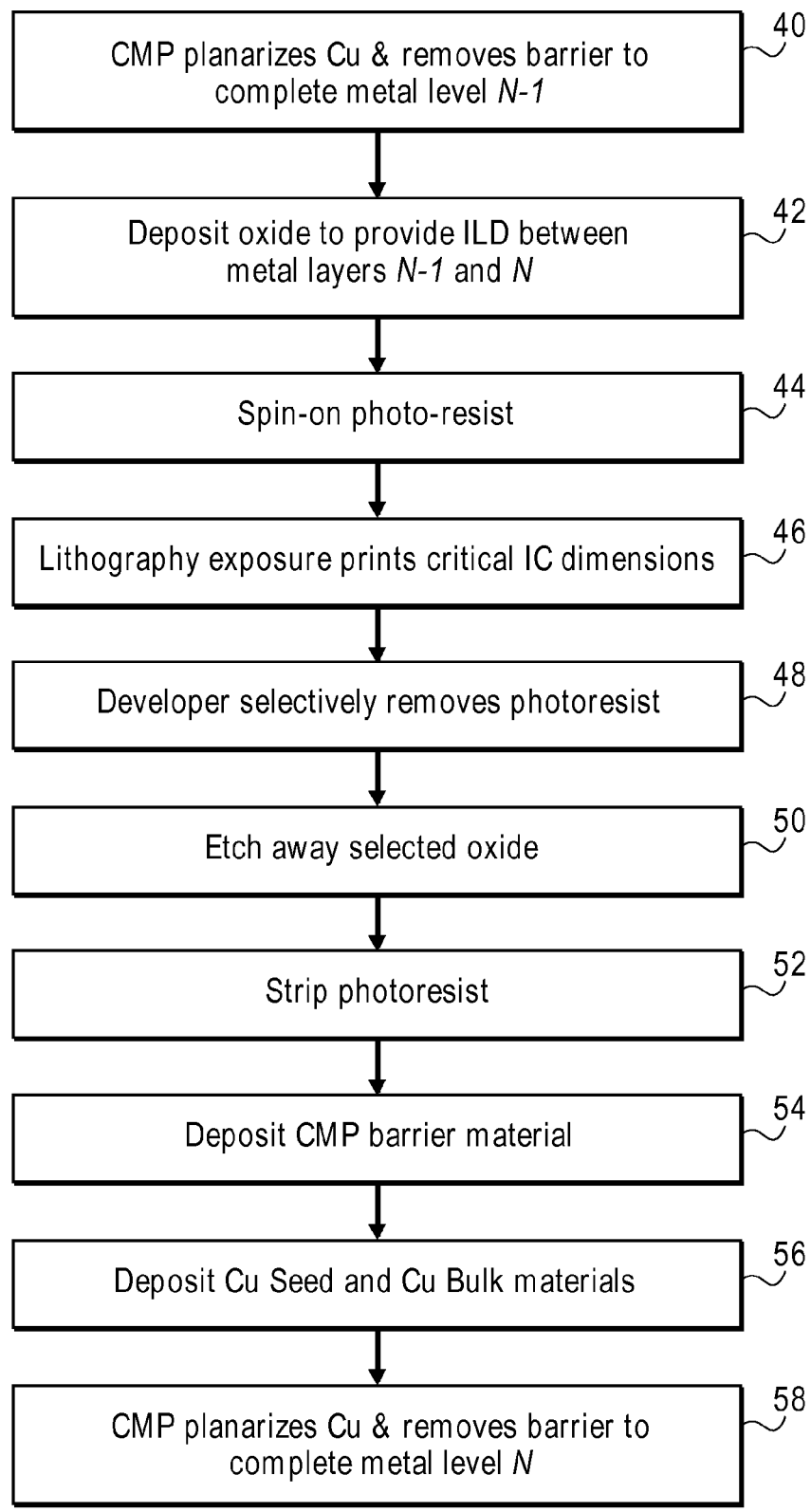
FIG. 4 shows where lithography fits within a damascene process.

The damascene process flow for a given interconnect layer is described in FIG. 4. The flow begins with a post-CMP planarized surface 40 of the prior interconnect level (level N-1). A dielectric material (e.g. oxide or low-k material) is deposited 42 to electrically isolate the previous and current interconnect layers N-1 and N. (The dielectric forms what is called an inter-level dielectric or ILD layer. Although pattern dependencies due to underlying features may require a CMP planarization step on the ILD, that step is optional and is not shown in this flow example.) A photosensitive film (e.g. photoresist) is deposited on the ILD wafer surface 44. A lithography system images the wafer 46 to define circuit features for the current interconnect layer using a process similar to that illustrated in FIG. 1. A developer is used to selectively remove photoresist 48. Plasma etch is used to remove selective oxide areas 50 and the remaining photoresist is subsequently removed 52. A barrier material is then deposited 54 and subsequently ECD is used to deposit metal, for example copper 56. CMP is used to polish away selective copper areas and remove the barrier material 58. This completes the formation of metal interconnects for level N. Often pattern-related non-uniformity is transferred from underlying levels to overlying interconnect levels resulting in variations in the ILD and photoresist thickness that is imaged during lithography.

Figure 5:
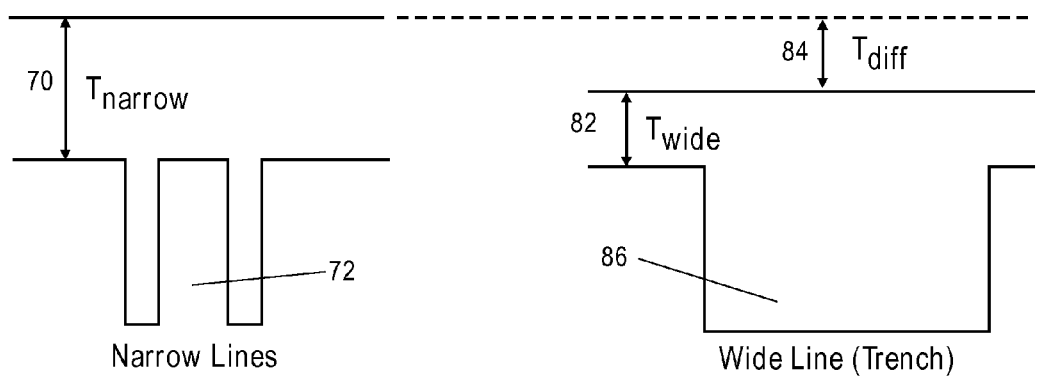
FIG. 5 illustrates pattern dependencies for electroplated copper deposition (ECD).

As described in FIG. 5, electroplated copper deposition (ECD) is a process step in a copper damascene flow that is used to deposit copper material within the interconnect structures. The goal is to completely fill an etched trench region in a void-free manner while minimizing a variation in the deposited copper thickness and minimizing a variation in surface topography. There exist pattern-dependencies in ECD that result in plated surface variation. FIG. 5 shows, for example, the difference in post-plated thickness $T_{diff}$ 84 commonly observed between the deposited copper thickness $T_{narrow}$ 70 that occurs over narrow line widths 72 and the deposited copper thickness $T_{wide}$ 82 that occurs over a wide line width or trench 86.

Film thickness variation in chemical mechanical polishing (CMP) processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thickness, even though a locally planar surface topography is achieved. This variation occurs in copper, oxide, and shallow trench isolation (STI) CMP and is described in following figures.

Figure 6A:
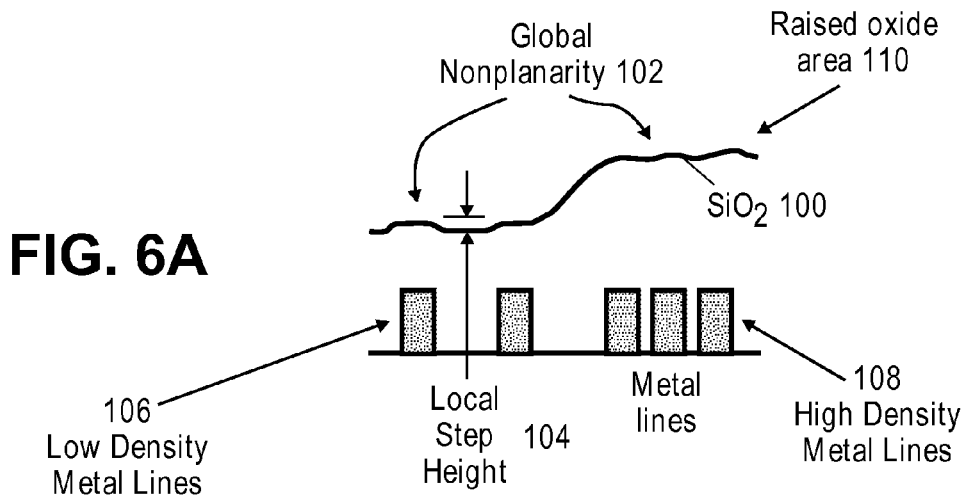
FIG. 6A illustrates film thickness variation that results from oxide chemical mechanical polishing (CMP).

For oxide polishing, the major source of variation is caused by within-die pattern density variation 102, shown as two groups of metal lines in FIG. 6A. The metal lines 106 on the left side of FIG. 6A have a lower density in the direction of the plane of the integrated circuit than do the metal lines 108 on the right side of the figure. Pattern density, in this case, is defined as the ratio of raised oxide area 110 divided by the total area of the region. The region may be taken as a square with the length of the sides equal to some length, for example, the planarization length. The planarization length is usually determined by process factors such as the type of polishing pad, CMP tool, slurry chemistry, etc.

Figure 7A:
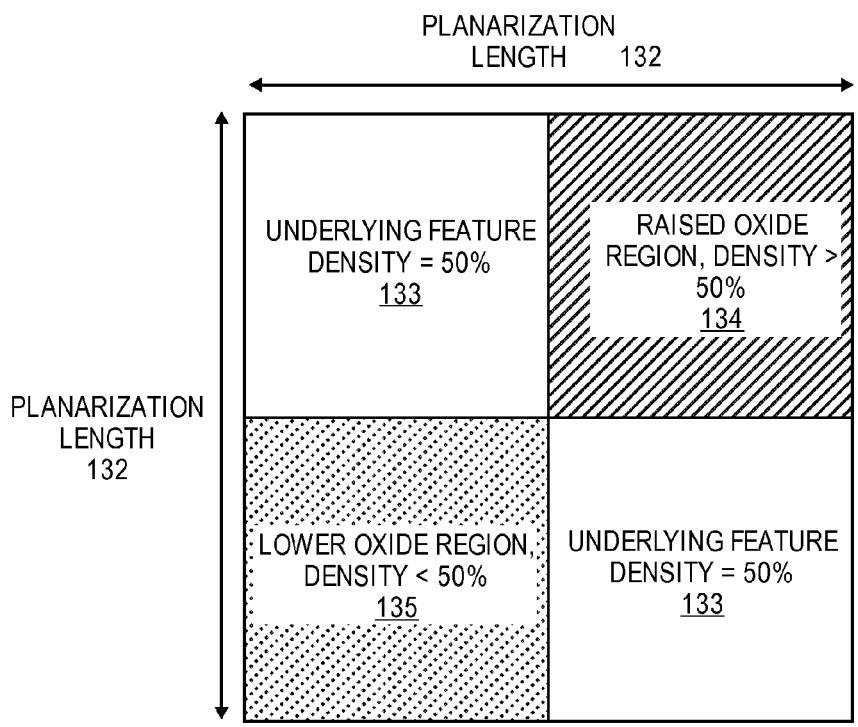
FIG. 7A illustrates a top-down view of different density features within a squareregion.
Figure 7B:
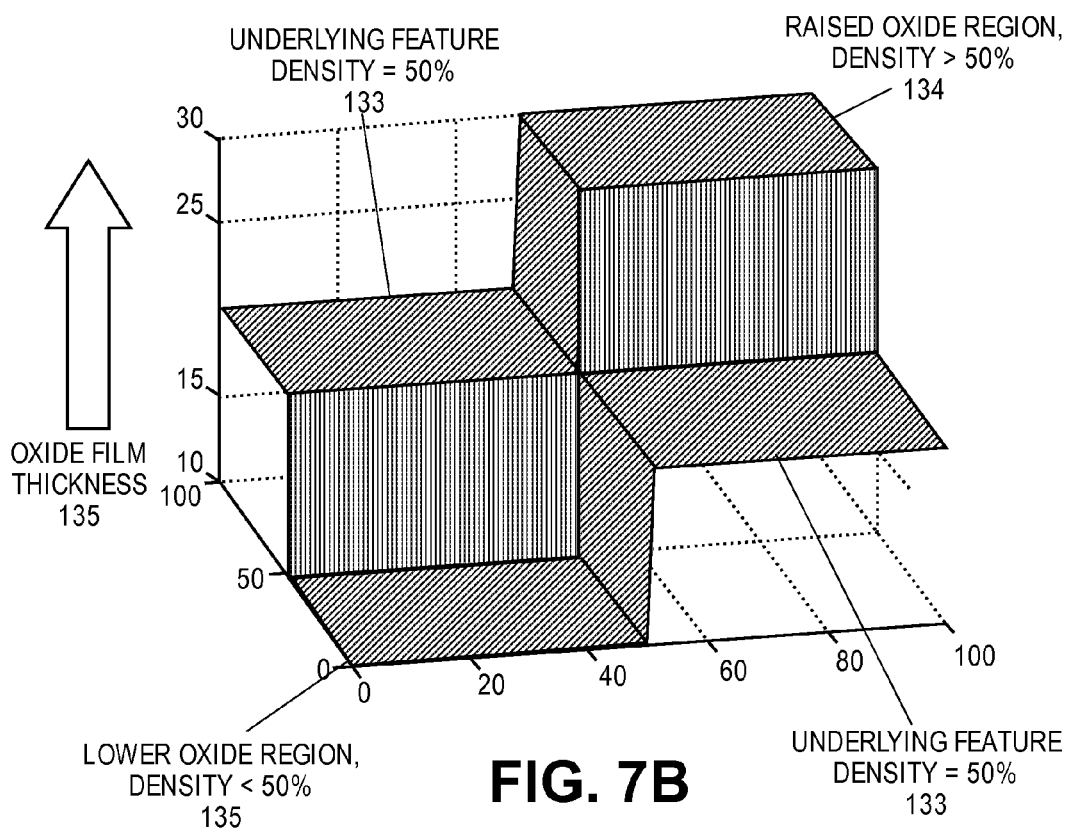
FIG. 7B illustrates the variation in oxide thickness for features within a region.

FIG. 7A illustrates an example of how the underlying feature density affects the film thickness variation. FIG. 7B plots the film thickness variation corresponding to each density type. For a given square area defined by planarization length 132, the higher underlying feature density leads to larger film thickness variation 134. The lower underlying feature density leads to a reduced film thickness 135. Designers often try to maintain density tightly around 50% 133 to promote planarity. The effective pattern density may be computed for each location on the die by filtering the designed layout densities, often by using various two-dimensional filters of densities around the given location. FIG. 6A illustrates how the underlying features 106 and 108 cause variation in local surface topography (step height) 104 and global non-planarity 102.

Figure 6B:
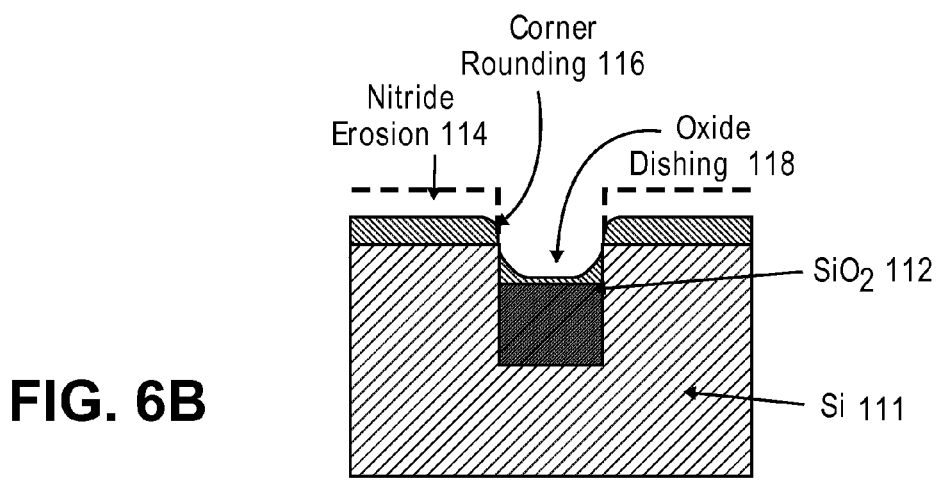
FIG. 6B illustrates erosion, dishing and corner rounding effects associated with a CMP step used in a process of forming of shallow trench isolation (STI).

In creating shallow trench isolation (STI) structures (examples are shown in FIG. 6B), $SiO_2$ 112 is deposited in a trench etched in silicon 111 and planarized using CMP to electrically isolate devices. As with oxide inter-level dielectric (ILD) polishing, the underlying pattern of isolated trenches results in unwanted variation in the deposited $SiO_2$. Problematic areas often are created as a result of CMP such as nitride erosion 114 (where the nitride barrier is removed and possibly exposes the underlying Si to contaminants and damage), corner rounding 116 and oxide dishing 118. The corner rounding has the effect of potentially widening the trench and where the exposure of Si 110 destroys the device. The oxide dishing results in topography variation that impacts subsequent lithography. In STI polishing, pattern density is an important feature with regard to topographical variation and other CMP effects.

Figure 6C:
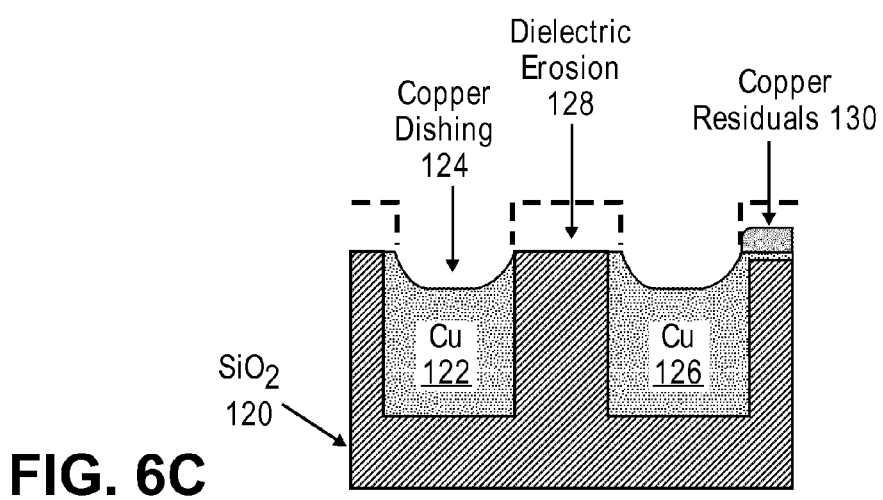
FIG. 6C illustrates copper dishing, dielectric erosion and residual copper effects associated with a copper CMP step used in damascene processes.

FIG. 6C illustrates the effects of polishing metal features (e.g., copper lines 122 and 126) entrenched in a dielectric (e.g., SiO.sub.2) 120, during a damascene CMP process. For metal polishing, computation of pattern density is important to characterizing full-chip pattern dependencies; however determining other physical layout effects, such as the line width and line space, may also be required. Two unwanted effects known as dishing and erosion result from metal damascene CMP. Dishing 124 is measured as the difference in metal thickness at the edge of a line and its center. Erosion 128 is defined as the difference in oxide thickness above a metal line, typically within an array of lines, to the oxide thickness in an adjacent unpatterned region. Another unwanted effect is residual copper 130 that is has not been removed from dielectric field (or up areas) of the chip and remains on the wafer after polishing is complete. It is common for process engineers to set polish times such that all residual copper is removed. For those patterned areas where copper is cleared first, dishing and erosion continue to occur, thereby increasing the non-uniformity of the wafer surface. Each of the described CMP processes contribute to surface level non-uniformity and thus may negatively impact lithography. While the techniques described here are applicable to any process related pattern dependencies, ECD and CMP are two processes that cause specific concern regarding non-uniformity. Although these processes will be used to illustrate the methods, the methods are applicable to pattern dependencies related to any process.

Figure 8:
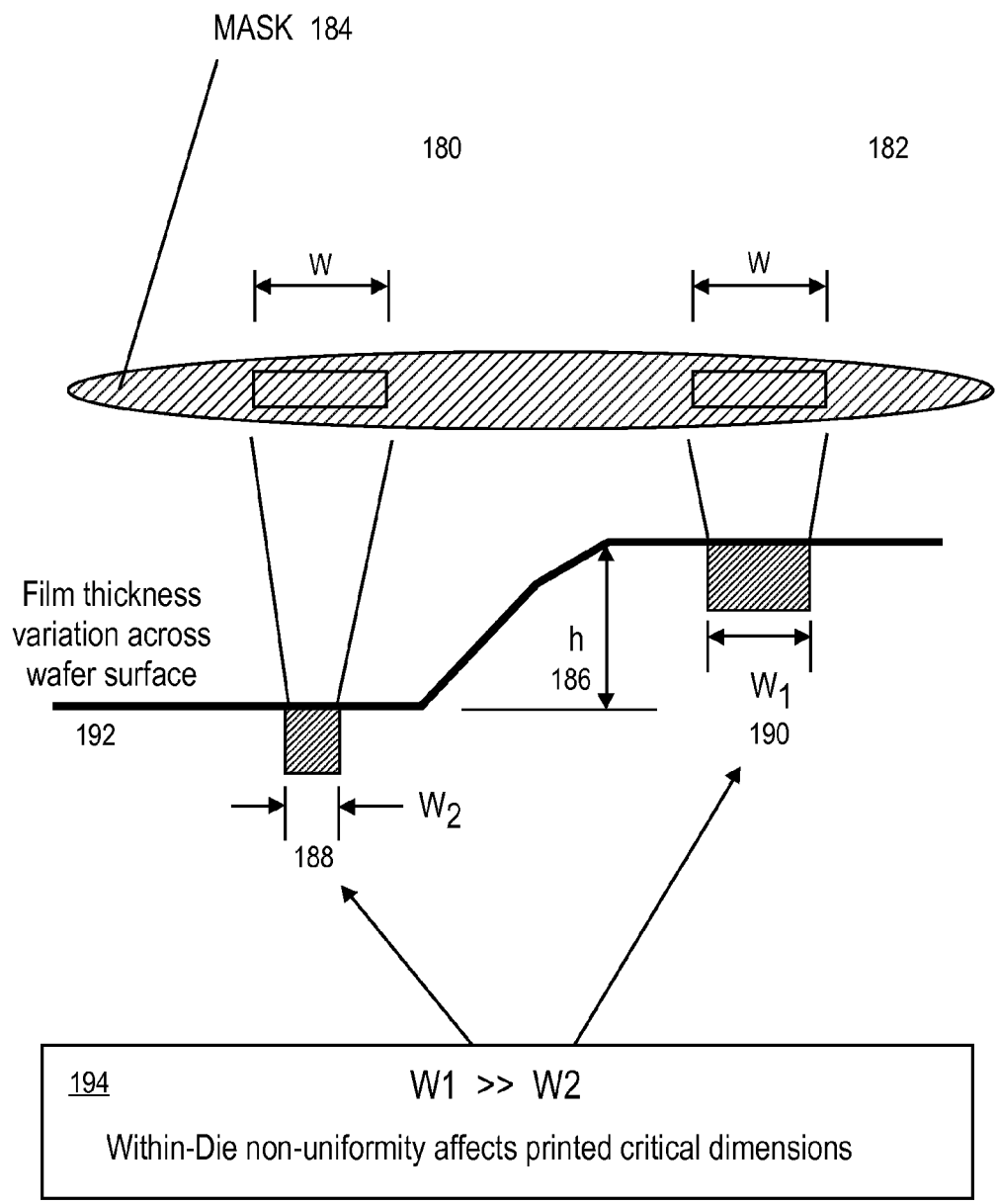
FIG. 8 illustrates how surface topography may affect printed feature dimensions.

The impact of process related pattern dependency on lithography is illustrated in FIG. 8. For the sake of clarity, the mask 184 and wafer 192 are shown and the related optics are not shown. As a matter of terminology used throughout, feature width (FW) is taken to be the smallest dimension of any given object. This term encompasses various types of layout objects, such as lines, rectangles, polygons, etc. Also, the critical dimension (CD) is understood to be the smallest dimension of any feature on the layout, i.e. the smallest FW.

A mask 184 is shown with two features with the same feature width, (w), 180 and 182 to be printed onto a wafer surface 192. When lithography is performed, the within-die non-uniformity 192 due to process-related pattern dependencies (as illustrated in FIGS. 5, 6, and 7) may result in a film thickness difference (Δh) 186 across the chip between the two printed line widths $w_2$ 188 and $w_1$ 190. In this case 194, the printed line width $w_1$ 190 is much larger than $w_2$ 188. Although both line widths 180 and 182 have been designed and created on the mask with the same dimensions, surface level non-uniformity may result in significantly different dimensions in the printed features 188 and 190, which subsequently affects the performance of the manufactured IC.

Figure 9:
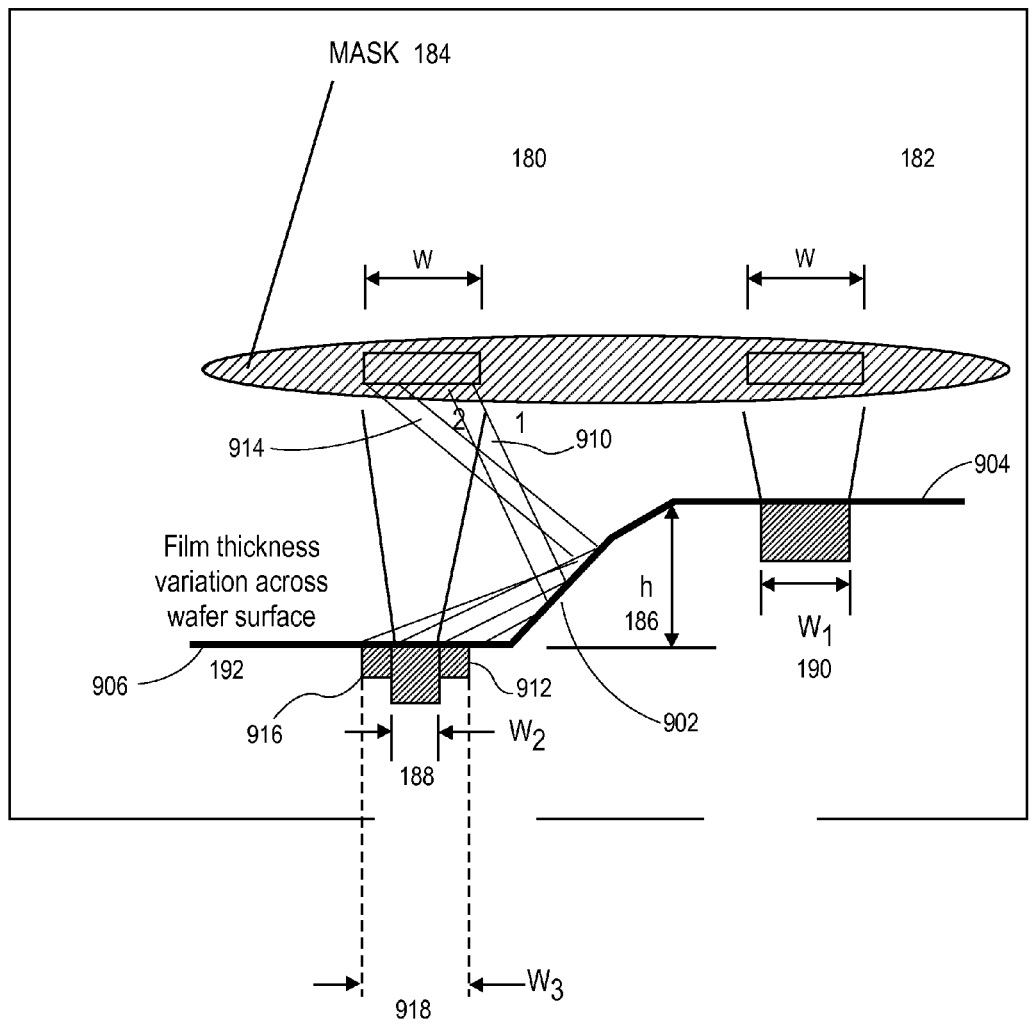
FIG. 9 illustrates how surface topography may cause reflectance variations.

FIG. 9 reproduces the topography of FIG. 8 to illustrate the possible effects of reflections on printed patterns. It is noted that the thickness difference Δh 186 across the chip results in a sloped surface 902 that intermediates between the higher surface 904 and the lower surface 906. The sloped surface 902 may have a shape that is generally flat, a shape that is generally curved, or a combination of the two types of shapes, with the exact shape of the sloped surface 902 highly dependent upon the characteristics of underlying surfaces and the processing equipment/methods being used. To reduce the complexity of the drawing, light surface reflections are shown but this approach may include characterization of the propagation of light through the resist as well.

Consider light 910 that is projected from the mask 184 at an angle $\theta_1$, with the light 910 reflecting off the sloped surface and projecting upon the wafer surface 192 at location 912. Further consider light 914 that is projected from the mask 184 at an angle $\theta_2$, with the light 914 reflecting off the sloped surface and projecting upon the wafer surface 192 at location 916.

The results of projecting additional light at locations 912 and 916 may result in the line width $w_3$ 918 being printed on wafer surface 192. In this example, the width $w_3$ 918 when reflection is considered differs from the widths $w_2$ 188 that was predicted when using just the height and depth of focus of the surface 192 by themselves. This illustrates the problem and possible errors that may arise with prior models which attempt to predict width characteristics without considering reflection.

Figure 10:
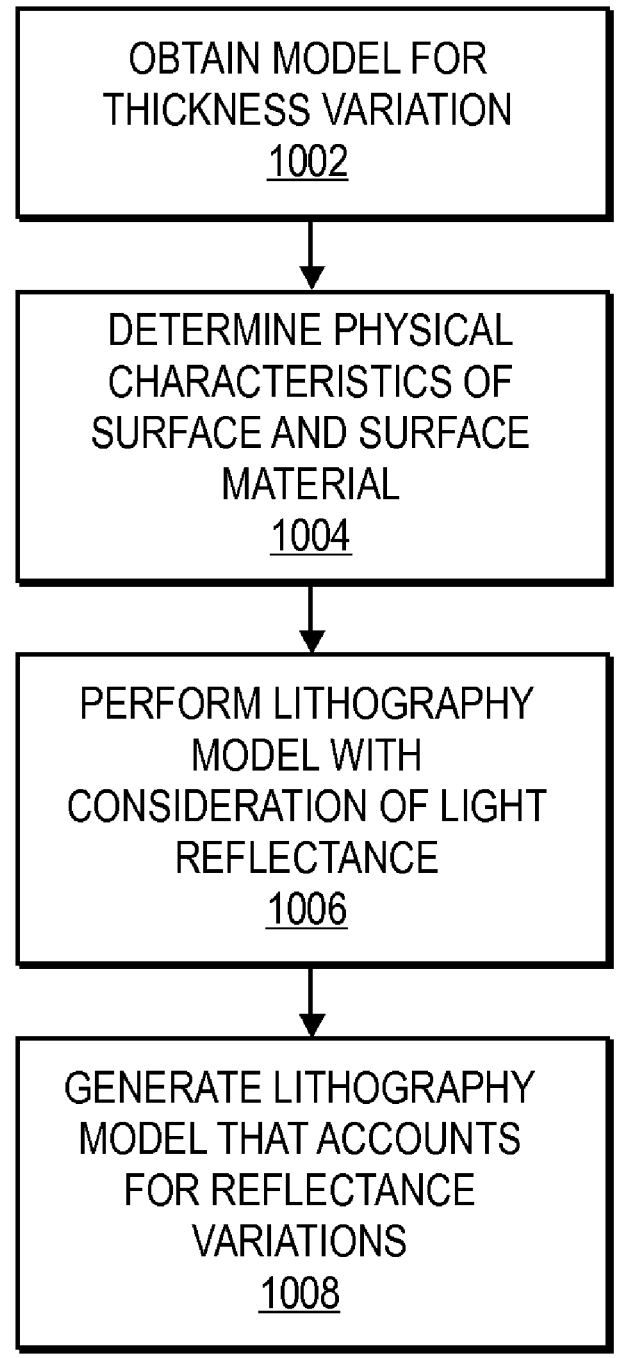
FIG. 10 shows a process for analysis based upon reflectance variation.

FIG. 10 shows a flowchart of a method that accounts for reflectance-related process variations according to an embodiment of the invention. At 1002, one or more manufacturing or process models are obtained which is capable of addressing thickness variations in the IC design. An example of such a model is a CMP model that accounts for thickness variations, e.g., as described in U.S. patent application Ser. No. 11/005,651, filed on Dec. 6, 2004, which is hereby incorporated by reference in its entirety.

At 1004, the method determines the physical characteristics of the material from which projected light may be reflected. Such physical characteristics include, for example, the material and molecular composition of the photoresist material, as well as its reflective properties, such as the material's coefficient of reflectance. The material composition will also affect the amount and/or type of reflection that will occur, and help determine whether the reflected light will change with respect to intensity, phase, wavelengths, etc. In addition, a determination can be made regarding whether the material has received any sort of treatment or coating to become more anti-reflective, or if the material is inherently anti-reflective and its extent of resistance to reflectance. In addition, a determination can be made regarding the projected light absorbed and transmitted through the resist. The propagation of light through the resist will influence spatial variation between the top and bottom of the exposed resist layer and may influence the resulting shape of the printed feature. The light may also reflect off an underlying material and toward the top surface of the photoresist inducing variation in the resulting feature shape as well. Variation in underlying material thickness may influence how the light propagates through the resist as well. The thickness of multiple layers of material may need to be considered.

A determination can also be made of the physical shape of the reflection surface, including a determination of it relative flatness and/or any curved characteristics. One approach to making this determination is to use processing models to anticipate the shape of the photoresist materials based upon the shape of the underlying layers of materials. The angle of the sloped surface will be determined as well.

An identification can be made of the specific light properties associated with the projected light. Certain types of light will interact differently than other types of light with given photoresist materials. The method will identify or be given the interaction properties for the specific type of light as it relates to the specific type of photoresist material that is being used.

The quality of the photoresist may also be considered. The surface quality of the material is highly dependent upon characteristics of underlying surfaces and the processing equipment/methods being used. In some circumstances, the surface quality is relatively uniform and flat while in other circumstances the surface quality could be relatively rough or uneven. The quality of the surface could be evaluated at several different levels of granularities, e.g., at the molecular level or at much higher levels. The importance of this factor is that surface qualities may be significant with respect to whether the reflected light will be specular or diffuse. A more uniform and surface having better reflective qualities will be more likely to cause a specular reflection, whereas a lower quality surface having significant imperfections will be more likely to cause a diffuse reflection. The quality of the bulk photoresist may also need to be considered in terms of the effect on propagating light that defines the feature at the top and bottom of the resist layer.

At 1006, lithography simulation is performed to determine the effects of reflection on the IC product. The surface characteristics, light characteristics, as well as characteristics of nearby structures are considered to compute the effects on reflected light on the printed lithography patterns. The simulation will take into account both systematic variations as well as random variations that may occur during lithography. At 1008, one or more lithography models are generated based upon the results of the lithography simulation.

Figure 11:
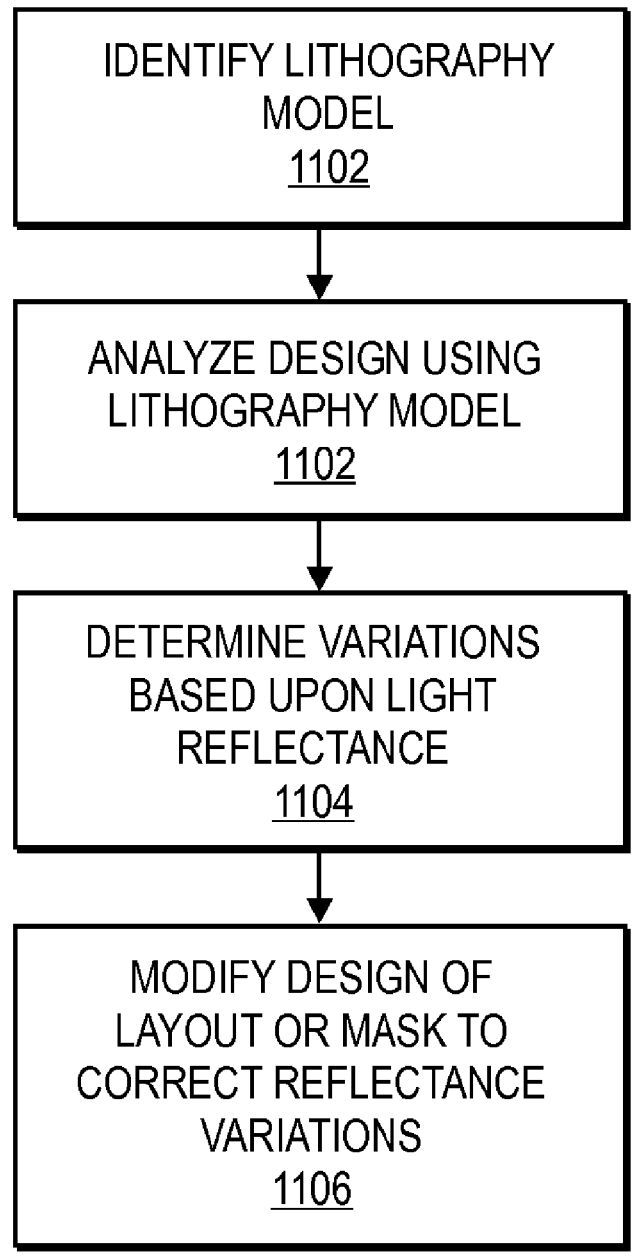
FIG. 11 shows a process for modifying a design to correct reflectance variation.

FIG. 11 shows a flowchart of a process to modify an IC design to account for reflectance-related process variations. At 1102, the method identifies the appropriate lithography model to be used for a particular IC design and process. At 1102, the IC design is analyzed using the identified lithography model.

At 1104, a prediction is made regarding the likelihood of reflectance-related variations based upon lithography processing. Some of the variations that will be identified includes, for example, reflectance-related width and spacing variations. The electrical effects of the variations may also be considered, e.g., for line-related patterns and structures. Electrical simulation may be used to verify the functionality and performance of the IC design. The prediction and specifications of the IC design may be compared to identify problematic areas.

At 1106, the IC design and/or the mask deign is modified to account for and correct any unacceptable reflectance-related variations. Corrections to the IC design are applied to modify the design so that the lithography process yields the desired feature dimension levels. For example, in the example of FIG. 9, excessive width variations in the printed line may be corrected by reducing the size of the mask opening associated with the line pattern. The corrections to the IC design could also include, for example, modification of OPC (optical proximity correction) features.

Modifications can be made to one or more processes to address the reflectance-related variations, such as process settings of one or more process including for example, CMP, deposition, lithography, or etch processes. For example, film stacks can be modified to address the predicted or actual variations.

SYSTEM ARCHITECTURE OVERVIEW

Figure 12:
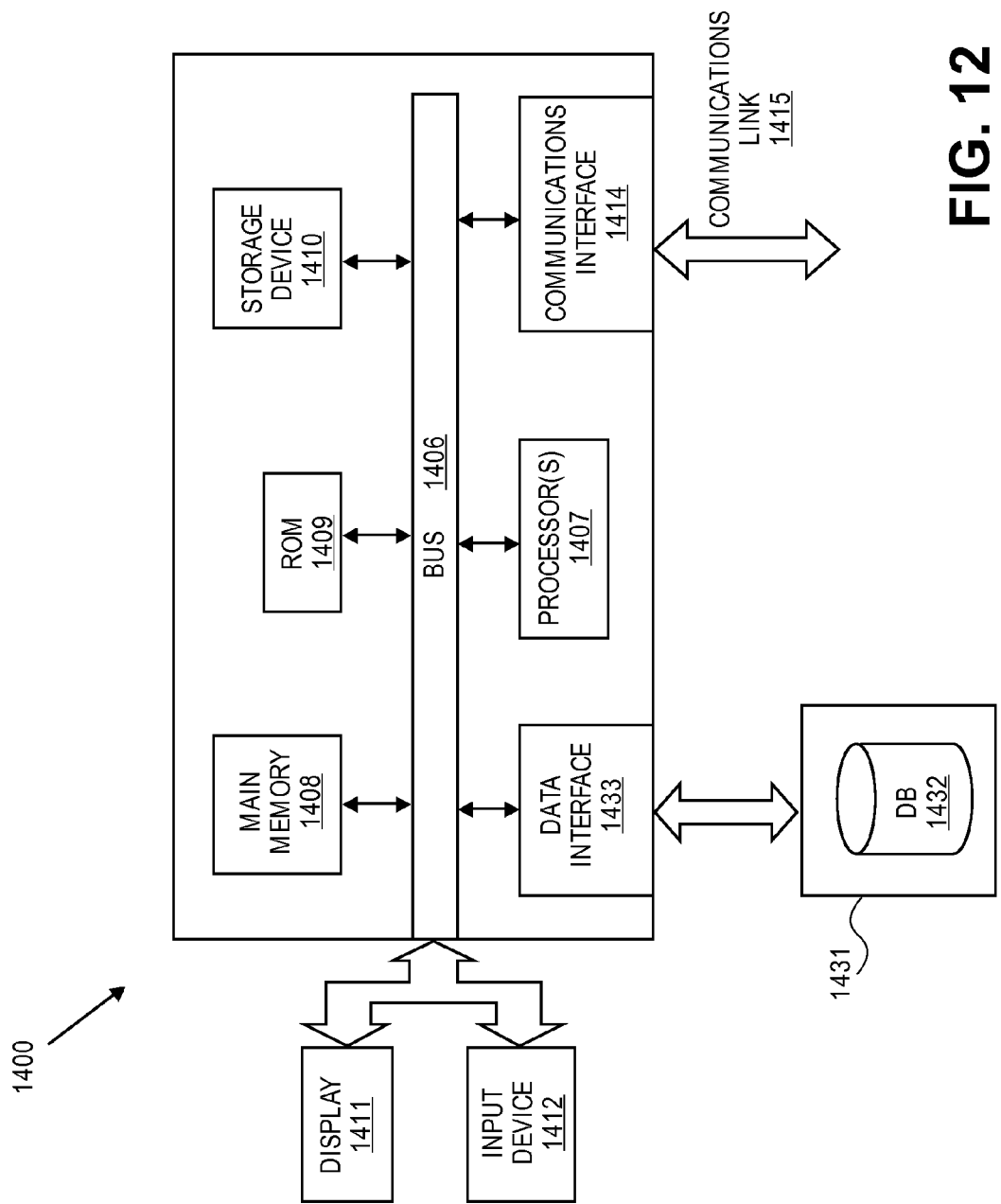
FIG. 12 shows an architecture of an example computing system with which the invention may be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for handling reflectance-related process variations for an integrated circuit design, comprising:
    using a computer system which comprises at least one processor and is configured for:
        accessing one or more models relating to manufacturing of the integrated circuit design;

determining one or more physical characteristics of a surface for the integrated circuit design, wherein at least one of the physical characteristics of the surface comprises topographical variation of at least a portion of the surface;

performing simulation to determine effects of reflection for the integrated circuit design by simulating at least one characteristic of an interaction between a lithography light source and a photoresist layer;

generating a lithography model that accounts for reflectance-related process variations; and storing the lithography model in a computer readable storage medium or a computer storage device.

2. The method of claim 1 in which the one or more physical characteristics comprises a material composition, molecular composition, material treatment, material coating, thickness, or reflective properties.

3. The method of claim 2 in which the reflective properties include a coefficient of reflectance.

4. The method of claim 1 further comprising determining amount or quality of absorption or transmission of light through photoresist material.

5. The method of claim 1 further comprising analysis of reflection for an underlying material.

6. The method of claim 1 in which the one or more physical characteristics comprises a physical shape of the surface.

7. The method of claim 6 in which the physical shape comprises a flatness, angle, or curve of the surface.

8. The method of claim 6 in which processing models are used to anticipate a shape of photoresist materials based upon shapes of the underlying layers of materials.

9. The method of claim 1 further comprising determining light properties associated with projected light.

10. The method of claim 1 further comprising determining photoresist properties.

11. The method of claim 1 in which the simulation is lithography simulation.

12. The method of claim 11 in which the simulation takes into account systematic and random variations.

13. The method of claim 1 in which the one or more models correspond to one or more of the following manufacturing processes: chemical mechanical polishing, etch, lithography, or deposition.

14. A computer implemented method for handling reflectance-related process variations for an integrated circuit design, comprising:

using a computer system which comprises at least one processor and is configured for:

accessing one or more models relating to manufacturing of the integrated circuit design, in which the one or more models accounts for reflectance-related process variations;

analyzing the integrated circuit design using the one or more models;

determining one or more variations for the integrated circuit design, in which the one or more variations are determined based at least in part on lithography reflections by simulating at least one characteristic of an interaction between a lithography light source and a photo resist layer, and at least one of the one or more variations comprises topographical variation of at least a portion of a surface of the integrated circuit design;

modifying the integrated circuit design or a manufacturing process to address the one or more variations; and storing the modified integrated circuit design in a computer readable storage medium or a computer storage device.

15. The method of claim 14 in which the one or more variations comprise reflectance-related width or spacing variations.

16. The method of claim 14 in which electrical effects of the one or more variations are analyzed.

17. The method of claim 16 in which electrical simulation is performed to verify the functionality and performance of the integrated circuit design.

18. The method of claim 14 in which the integrated circuit design is modified such that lithography processing yields desired feature dimension levels for the integrated circuit design.

19. The method of claim 18 in which excessive width variations in a printed line is corrected by reducing a size of a mask opening associated with a line pattern.

20. The method of claim 18 in which an OPC feature is modified.

21. The method of claim 14 in which the manufacturing process comprises CMP, deposition, lithography, or etch.

22. The method of claim 14 in which film stacks are modified to address the one or more variations.

23. A computer program product that includes a computer readable storage medium, the computer readable medium comprising a plurality of computer instructions which, when executed by a processor, cause the processor to execute performing a process for handling reflectance-related process variations for an integrated circuit design, the process comprising:

using a computer system which comprises at least one processor and is configured for:

accessing one or more models relating to manufacturing of the integrated circuit design;

determining one or more physical characteristics of a surface for the integrated circuit design, wherein at least one of the physical characteristics of the surface comprises topographical variation of at least a portion of the surface;

performing simulation to determine effects of reflection for the integrated circuit design by simulating at least one characteristic of an interaction between a lithography light source and a photoresist layer;

generating a lithography model that accounts for reflectance-related process variations; and storing the lithography model in a computer readable storage medium or a computer storage device.

24. A computer program product that includes a computer readable medium, the computer readable storage medium comprising a plurality of computer instructions which, when executed by a processor, cause the processor to execute performing a process for handing reflectance-related process variations for an integrated circuit design, the process comprising:

using a computer system which comprises at least one processor and is configured for:

accessing one or more models relating to manufacturing of the integrated circuit design, in which the one or more models accounts for reflectance-related process variations;

analyzing the integrated circuit design using the one or more models;

determining one or more variations for the integrated circuit design, in which the one or more variations are determined based at least in part on lithography reflections by simulating at least one characteristic of an interaction between a lithography light source and a photo resist layer, and at least one of the one or more variations comprises topographical variation of at least a portion of a surface of the integrated circuit design;

modifying the integrated circuit design to address the one or more variations; and storing the modified integrated circuit design in a computer readable storage medium or a computer storage device.

25. A system for handling reflectance-related process variations for an integrated circuit design, comprising:

a computer system which comprises at least one processor and is configured for:

accessing one or more models relating to manufacturing of the integrated circuit design;

determining one or more physical characteristics of a surface for the integrated circuit design, wherein at least one of the physical characteristics of the surface comprises topographical variation of at least a portion of the surface;

performing simulation to determine effects of reflection for the integrated circuit design by simulating at least one characteristic of an interaction between a lithography light source and a photoresist layer;

generating a lithography model that accounts for reflectance-related process variations; and a computer readable storage medium or a computer storage device for storing the lithography model.

26. A system for handling reflectance-related process variations for an integrated circuit design, comprising:

a computer system which comprises at least one processor and is configured for:

accessing one or more models relating to manufacturing of the integrated circuit design, in which the one or more models accounts for reflectance-related process variations;

analyzing the integrated circuit design using the one or more models;

determining one or more variations for the integrated circuit design, in which the one or more variations are determined based at least in part on lithography reflections by simulating at least one characteristic of an interaction between a lithography light source and a photo resist layer, and at least one of the one or more variations comprises topographical variation of at least a portion of a surface of the integrated circuit design;

modifying the integrated circuit design to address the one or more variations that are based at least in part on the lithography reflections; and a computer readable storage medium or a computer storage device programmed for storing the modified integrated circuit design.

27. The computer implemented method of claim 1, wherein at least one of the one or more models provides information or data about pattern dependency of the integrated circuit design.

28. The computer implemented method of claim 1, wherein at least one of the one or more models provides information or data about thickness variation or non-uniformity of one or more integrated circuit features in the integrated circuit design.

29. The computer implemented method of claim 1, wherein at least one of the one or more models provides information or data about die-to-die variability, within die variability, or wafer-level variability for the integrated circuit design.

30. The computer implemented method of claim 1, wherein at least one of the one or more physical characteristics of the surface comprises a material composition or molecular composition of a material to be used in the manufacturing of the integrated circuit design.

31. The computer implemented method of claim 1, wherein the act of determining the one or more physical characteristics comprises:

determining spatial variation within at least a portion of a material to be used in the manufacturing of the integrated circuit design; and determining resulting shape of a printed feature of the integrated circuit design based at least in part upon the spatial variation.

32. The computer implemented method of claim 1, wherein the act of determining the one or more physical characteristics comprises:

analyzing two or more adjacent layers of materials to be used in the manufacturing of the integrated circuit design; and determining the one or more physical characteristics based at least in part upon a result of the act of analyzing the two or more adjacent layers of materials.

33. The computer implemented method of claim 32, wherein the act of analyzing two or more adjacent layers of materials comprises:

determining one or more interactions between the two or more adjacent layers of materials; and determining an impact on the manufacturing based at least in part upon the one or more interactions between the two or more adjacent layers.

* * * * *